(12) United States Patent
Eusterholz

(10) Patent No.: US 8,523,586 B2
(45) Date of Patent: Sep. 3, 2013

(54) TERMINATING AND CONNECTING DEVICE

(75) Inventor: Helmut Eusterholz, Paderborn (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 79 days.

(21) Appl. No.: 13/384,458

(22) PCT Filed: Jul. 12, 2010

(86) PCT No.: PCT/EP2010/004226
§ 371 (c)(1),
(2), (4) Date: Jan. 17, 2012

(87) PCT Pub. No.: WO2011/006628
PCT Pub. Date: Jan. 20, 2011

(65) Prior Publication Data
US 2012/0122336 A1    May 17, 2012

(30) Foreign Application Priority Data
Jul. 15, 2009 (DE) .......................... 10 2009 033 481

(51) Int. Cl.
*H01R 13/62* (2006.01)
(52) U.S. Cl.
USPC .......................................... 439/259; 439/76.1
(58) Field of Classification Search
USPC ................... 439/259, 263, 535, 76.1
See application file for complete search history.

(56) References Cited

U.S. PATENT DOCUMENTS

| 4,460,232 | A  | * | 7/1984 | Sotolongo ..................... 439/535 |
| 7,618,265 | B2 | * | 11/2009 | Rueggen et al. ............. 439/76.1 |
| 7,737,355 | B2 |   | 6/2010 | Nieleck et al. |
| 2005/0054219 | A1 | * | 3/2005 | Werner et al. ................ 439/76.1 |
| 2006/0289053 | A1 | * | 12/2006 | Nieleck et al. ................ 136/244 |

FOREIGN PATENT DOCUMENTS

| DE | 103 58 140 A1 | 9/2005 |
| DE | 10 2005 025 632 A1 | 12/2006 |
| DE | 10 2007 006 433 A1 | 8/2008 |
| DE | 20 2008 006 116 U1 | 8/2008 |

OTHER PUBLICATIONS

International Search Report for International Application No. PCT/EP2010/004226 Dated Dec. 23, 2010.

* cited by examiner

*Primary Examiner* — Hien Vu
(74) *Attorney, Agent, or Firm* — Roberts Mlotkowski Safran & Cole, P.C.; David S. Safran

(57) ABSTRACT

A terminating and connecting device with a housing having a lower and upper housing parts, at least one contact spring for electrically contacting at least one terminal lead, at least one terminal element for connecting at least one cable, and at least one metal part for connecting the contact spring to a cable connected by the terminal element. The housing upper part has at least one actuating element and a contact spring. The contact spring has two contact legs connected by a back, and the lower housing part has a top spring has two spring legs and a back which connects the spring legs. When the housing upper part is pressed onto the housing lower part, the actuating element presses on the back of the top spring so that the top spring moves into a position such that the terminal lead is clamped between the contact legs.

21 Claims, 15 Drawing Sheets

TERMINATING AND CONNECTING DEVICE

BACKGROUND OF THE INVENTION

1. Field of the Invention

The invention relates to a terminating and connecting device for electrical connection of an electrical device, especially a solar module, with a housing which has a housing lower part and a housing upper part, with at least one contact spring for electrical contacting of at least one terminal lead coming from the electrical device, with at least one terminal element located in the housing for connecting at least one cable and with at least one metal part via which the terminal lead contacted by the contact spring can be connected to a cable connected by the terminal element in an electrical conductive manner, the housing having at least one opening for inserting the cable, the contact spring, the terminal element and the metal part being assigned to the housing lower part and there being at least one actuating element on the housing upper part, and the contact spring, when the housing upper part is placed or pressed onto the housing lower part, is movable out of a first position in which the contact spring does not make contact with the terminal lead into a second position in which the terminal lead is contacted by the contact spring.

2. Description of Related Art

To connect an electrical device to a cable or to connect a cable to an electrical device, a terminating and connecting device is often used. The terminating and connecting device which is also often called a junction box is attached with its housing to one side of the device, the terminal lead or terminal leads of the device being routed through the housing wall of the device on this side. Within the junction box, there is a terminal to which, on the one hand, the terminal leads of the device, and on the other hand, the cores of the cable inserted into the housing through the openings can be connected, and thus, they can be electrically connected to one another.

Even if these terminating and connecting devices can be used in a plurality of electrical devices, for example, as a motor terminal box or as a transformer terminal box, a solar module is described below as a preferred example for an electrical device, in which the junction box is attached on the back of the solar module facing away from the sun side, without the invention being limited thereto.

In recent years, photovoltaic solar modules have been increasingly used to produce electrical current from sunlight. These solar modules, which are often also called solar panels, are formed of a plurality of individual solar cells which lie next to one another, are located between a common front cover layer and a common back cover layer and are wired to one another. In order to achieve higher voltages, generally several solar modules are connected in series. For this reason, a junction box is attached on the back of each solar module facing away from the sun side. The terminal leads coming from the solar cells of the solar module are connected in an electrically conductive manner in the junction box to corresponding terminal elements which are connected to the terminal elements for the external cables. The electrical connection to the terminal elements of the junction box of the terminal leads which come from the solar module and which are generally flat ribbons is generally produced manually by soldering or using screws.

The effort in the mounting of the known junction boxes on the solar modules is relatively high due to the manual connecting (soldering or screws) of the terminal leads to the terminal elements provided in the junction box. German Patent Application DE 10 2005 025 632 A1 and corresponding U.S. Pat. No. 7,444,743 disclose a junction box in which the mounting of the junction box on a solar module and the production of the junction box are to be simplified. In the known junction box, which has a pot-shaped housing lower part and a housing cover, in the interior of the housing lower part, there are several pressed screens via which the first terminal elements for connecting the terminal leads coming from the solar module are electrically connected to the second terminal elements for connecting the cables. While the first terminal elements each have a clamp spring, the second terminal elements are made as crimp terminals for connecting the cable.

The connection of a terminal lead (flat ribbon) of the solar module to a section of the pressed screen takes place by a terminal lead which has been inserted into the housing through an opening being wrapped around a terminal web formed on the pressed screen and then clamped tight by slipping on the clamp springs. In this junction box the electrical terminal of the terminal leads of the solar module is therefore connected with a relatively high manual effort.

German Patent Application DE 103 58 140 B4 and corresponding U.S. Pat. No. 7,737,355 disclose a junction box for a solar cell module which also has a pot-shaped housing lower part and a housing cover. This junction box has a clamping spring with two spring legs which act opposite one another and between which the flat ribbon which is to be connected is inserted. In order to avoid kinking of the flat ribbon when inserted into the junction box, underneath the clamp spring there is a guide means with an insertion funnel within which the flat ribbon is guided in the transverse direction with little play. However, the problem here is that the clamp spring must be opened by the flat ribbon when it is inserted in order to travel into the clamping site between the two spring legs.

German Patent Application DE 10 2007 006 433 A1 discloses an initially described junction box with a two-part housing in which both the terminal element for the terminal lead and also the terminal element for the cable are made as clamp springs. Each of the clamp springs have a clamping leg and are connected to one another via an essentially U-shaped metal part. The clamp springs for connecting the terminal lead of the solar module can be pivoted out of a first position in which a terminal lead can be inserted between the clamping leg and a contact section of the metal part into a second position in which the terminal lead is contacted by clamping between the clamping leg and the contact section of the metal part. The production of the electrical connection between the terminal lead and a cable is simplified in that on the hood-shaped housing upper part there is an actuating element which projects to the inside and which pivots the clamp spring out of the first position into the second position when the housing upper part is seated completely on the housing lower part so that a terminal lead which has been inserted between the clamping leg of the clamp spring and the contact section of the metal part is automatically contacted and thus manual actuating of the clamp spring is not necessary.

The known junction box is mounted on the solar module such that first the cables are connected to the corresponding clamp springs, then the housing upper part is partially seated on the housing lower part, then the housing which has been pre-mounted in this way is seated on the solar module so that the terminal leads of the solar module which stand vertically upwards as much as possible are inserted through two openings in the housing lower part each between the clamping legs of an opened clamp spring and the contact section of a metal part, and finally the housing upper part is pressed in the direction of the housing lower part, as a result of which the two clamp springs are pivoted such that the terminal leads are automatically contacted.

Difficulties can arise in the known junction box when the terminal leads do not essentially project vertically from the solar module or when the junction box is not positioned accurately enough since it can happen that the terminal leads do not travel through the openings in the housing lower part between the clamping leg of the opened clamp springs and the contact section of the metal parts.

SUMMARY OF THE INVENTION

Therefore, the object of the invention is to make available a terminating and connecting device for the electrical connection of an electrical device, especially of a solar module, which is made such that it can be easily and reliably mounted, and the mounting should take place preferably automated. Moreover, the junction box should be less sensitive to tolerances of the terminal leads and their position.

This object is achieved in the initially described terminating and connecting device in that the contact spring has two contact legs and a back which connects the contact legs and that there is a top spring which has two spring legs and a back which connects the spring legs, when the housing upper part is seated or pressed onto the housing lower part the actuating element which projects to the inside on the housing upper part pressing on the back of the top spring so that the top spring is moved out of a first position into a second position. The top spring is made and arranged movably relative to the contact spring such that the position of at least one contact leg of the contact spring is changed by the top spring such that the terminal lead is contacted by clamping between the two contact legs.

The terminating and connecting device in accordance with the invention, first of all, differs from the junction box known from German Patent Application DE 10 2007 006 433 A1 in that there is, additionally, a top spring which is moved out of a first upper position into a second lower position when the housing upper part is pressed onto the housing lower part, the top spring in the second lower position changing the position of at least one contact leg of the contact spring such that the terminal lead is contacted by being clamped between the two contact legs. The contact force on the terminal lead is thus not applied by the contact spring, but by the top spring. Since in the junction box, in accordance with the invention, the contact spring and the contact region of the contact spring is opened when seated on the solar module—and need not be opened as in the junction box of the terminal lead known from German Patent Application DE 103 58 140 B4 and corresponding U.S. Pat. No. 7,737,355—even thin terminal leads which are sensitive to kinking can be reliable and safely contacted.

Fundamentally, the contact spring can have either two elastic contact legs or one elastic and one rigid contact leg. In the former case, the two contact legs of the contact spring are pressed by the top spring into their second lower position, i.e., the two contact legs are changed in their position by both of them being deflected in the direction toward the terminal lead.

The terminating and connecting device then differs from the junction box known from DE 10 2007 006 433 A1 in that the terminal lead is not contacted between one leg of the contact spring and one leg of the metal part, but between the two elastic contact legs of the contact spring by clamping. Because the terminal lead is not clamped between one leg of the contact spring and the contact section of the metal part located at a short distance therefrom, the clamping site in the opened position can be chosen to be very large so that with the junction box in accordance with the invention terminal leads which have relatively large position tolerances can also be reliably contacted.

If the contact spring has one elastic leg and one rigid contact leg, only the elastic contact leg of the contact spring is deflected by the top spring into its second lower position. In doing so, the elastic contact leg is pressed in the direction of the rigid contact leg or the terminal lead so that the terminal lead is pressed away from the end region of the elastic contact leg against the end region of the rigid contact leg.

In this configuration of the contact spring, the rigid contact leg is preferably made integral with the metal part and the metal part is likewise preferably made integral with the terminal element for the cable, and the contact spring and the metal part can be produced easily as a punched and bent part. Moreover, especially good current transfer between the terminal lead and the metal part can also be achieved.

According to a preferred configuration of the invention, the end regions of the contact legs of the contact springs are bent toward one another so that the end regions form the contact region of the contact spring. In this way, essentially linear contact between the end regions of the contact leg and the terminal lead is accomplished, as a result of which the contact resistance between the contact spring and the terminal lead is reduced.

According to one advantageous configuration of the contact spring, the contact legs, proceeding from the back of the contact spring, are first bent toward one another and then again away from one another toward their end regions. In this way, the contact spring has a region located between the back and the end regions of the contact legs in which the contact legs have a shorter distance from one another. Due to this "pincer-shaped" configuration of the contact spring, the arrangement of the top spring on the contact spring can be implemented especially easily and still reliably. For this purpose, the top spring is located on the contact spring such that the ends of its spring legs overlap the back of the contact spring before the housing upper part is seated or pressed onto the housing lower part.

Preferably, the ends of the spring legs of the top spring are bent toward one another, the ends in the first position of the top spring ending in the region of the contact spring in which its contact legs have a shorter distance from one another. In this way, the top spring in the first position is attached to the contact spring, but the top spring can be pressed down, i.e., in the direction of the ends of the contact legs of the contact spring when the housing upper part is seated or pressed onto the housing lower part. In this "pressing down" or "slipping" of the top spring onto the contact spring, the end regions of the contact legs are compressed so that they make contact with a terminal lead which is located between them by clamping.

If the contact spring has one elastic and one rigid contact leg, the elastic contact leg is preferably made such as has been done previously with respect to the two contact legs, i.e., the elastic contact leg has an end region which is bent in the direction to the rigid contact leg, the end of the elastic contact leg being bent back. Moreover, in this case, the contact spring also preferably has a region in which the contact legs have a shorter distance from one another, for which the elastic contact leg, proceeding from the back of the contact spring, is bent first toward the rigid contact leg and then towards its end region again away from the rigid contact leg.

It was stated at the beginning that a terminal lead contacted by the contact spring can be connected via the metal part in an electrically conductive manner to the cable which is connected to the terminal element. Preferably the contact spring and the terminal element are connected in one piece to the metal part, as a result of which production and mounting of the junction box in accordance with the invention are simplified. The terminal element for connecting the external cable can be fundamentally the terminal elements known from the prior art, for example, a crimp terminal, screw terminal or tension spring terminal.

For easier arrangement and attachment of the metal part to the housing lower part preferably at least one contact carrier of insulating material is connected to the housing lower part in which the metal part or the contact spring connected to the metal part and the terminal element are held. The contact carrier can be located either as a separate component in the housing lower part or can be connected in one piece to the housing lower part.

According to one configuration of the junction box in accordance with the invention, the contact carrier which holds the metal part as well as the contact spring and the terminal element are movably connected to the housing lower part such that the contact carrier can be moved out of a first position into a second position. In the first position, the contact carrier is arranged such that the end regions of the contact legs of the contact spring are positioned above a terminal lead which is to be connected when the housing lower part is seated on the electrical device. In the second lower position of the contact carrier, conversely, the terminal lead is located between the end regions of the contact legs of the contact spring so that the terminal lead makes contact when the contact legs are compressed by the top spring.

Preferably, in this embodiment, the contact carrier can be fixed both in its first position and also in its second position, for which two catches are formed between the housing lower part and the contact carrier. For this purpose, for example, two catch recesses can be made on an inner side of the housing lower part and a corresponding catch projection can be made on the facing side of the contact carrier. When the housing upper part is pressed onto the housing lower part the contact carrier is thus moved out of its first position into its second position by the actuating element pressing on the back of the top spring when the housing upper part is pressed down, the force being transmitted to the contact spring via the top spring so that the contact spring is likewise first pressed down. Since the contact spring is connected to the metal part and the metal part is located in the contact carrier, thus the contact carrier is also pressed down into its second position. Only afterwards is the top spring displaced relative to the contact spring, i.e., the top spring is slipped onto the contact spring, as a result of which the contact legs are compressed.

According to another embodiment, the metal part is not connected integrally to the contact spring and the terminal element, but is connected via another component, especially a circuit board or a metal plate, for example, a lead frame, to the terminal element. Preferably, the contact spring and the metal part are also connected integrally to one another. In this version, the cable can be soldered to the other component so that the terminal element is made as a solder terminal which is located on the component.

The metal part is connected to the other component, especially a circuit board, preferably by the metal part on its free end which is not connected to the contact spring having a solder terminal pin, then a corresponding hole for inserting or pressing the solder terminal pin being made in the component. The electrical connection is further increased here by the solder terminal pin being soldered in the hole. In this embodiment, since the metal part is preferably connected in one piece to the contact spring, the use of the above described contact carrier can be eliminated.

According to another preferred configuration of the invention which can be implemented independently of whether there is one contact carrier at all and whether the contact carrier is connected rigidly or movably to the housing lower part, two catches are also made between the housing lower part and the housing upper part so that the housing lower part and the housing upper part can be fixed to one another both in the first position and also in the second position. This ensures that the housing upper part is neither pressed unintentionally onto the housing lower part, as a result of which the contact site between the two contact legs of the contact spring would be closed, nor that the housing upper part can be lifted unintentionally off the housing lower part and possibly lost.

It was stated at the beginning that the terminating and connecting device has at least one contact spring for making contact with at least one terminal lead, at least one terminal element for connection of at least one cable and at least one metal part. Generally, at least two terminal leads, made as flat copper ribbons, are electrically connected by the junction box to two cables which lead away from the junction box so that the junction box generally has two contact springs, two terminal elements, two metal parts and two top springs. In this "normal case," on the housing upper part, there are then also two actuating elements which project inward and which slip a respective top spring onto a contact spring when the housing upper part is locked onto the housing lower part.

The mounting of the terminal and connecting box in accordance with the invention on one side of an electrical device, especially on a solar module, can be further simplified and also automated by a cement layer being applied to the side of the housing lower part facing away from the housing upper part, i.e., to the side with which the housing lower part is seated on the solar module. In this way, the housing can be positioned automatically on the back of the solar module, and at the same time, can be attached by the cement layer. The cement layer can, at the same time, also perform the function of a seal.

In particular, there are a plurality of possibilities for embodying and developing the terminating and connecting box in accordance with the invention. In this respect reference is made to the following detailed description of preferred exemplary embodiments in conjunction with the accompanying drawings.

DETAILED DESCRIPTION OF THE INVENTION

Figure 1:
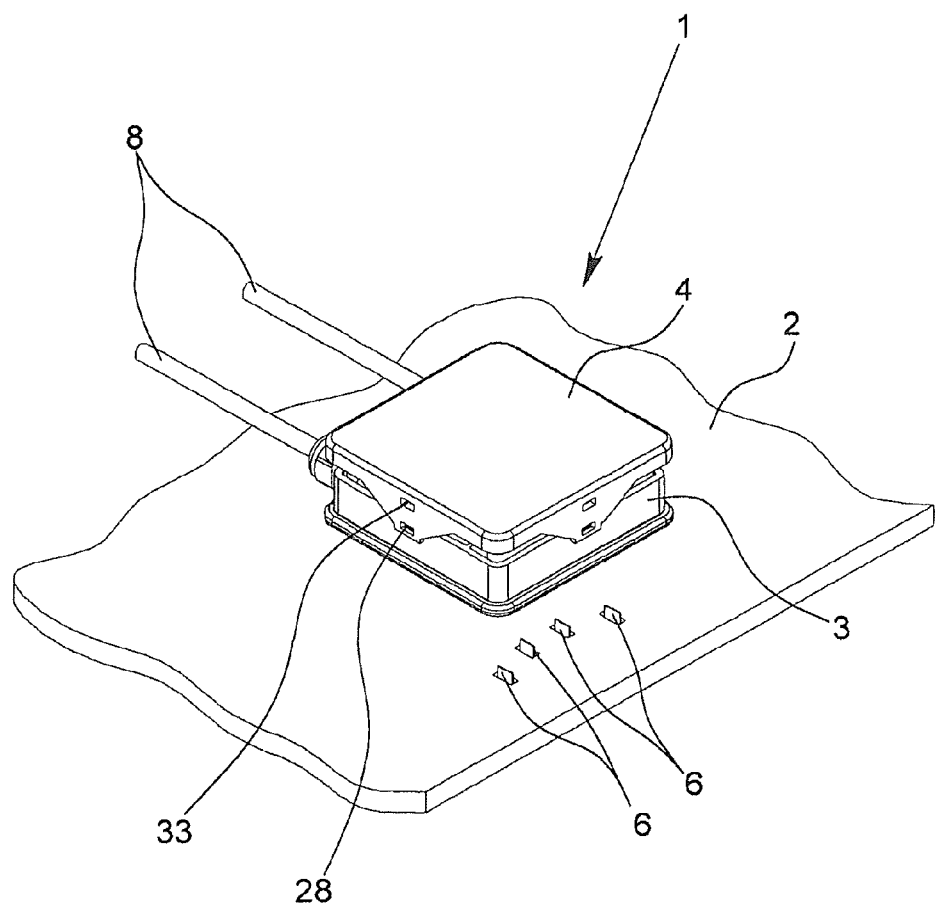
FIG. 1 is a perspective view of a terminating and connecting device and of a solar module.

The figures show a terminating and connecting device 1 in accordance with the invention, or parts thereof, for the electrical connection of a solar module 2. The terminating and connecting device 1, which is also called a junction box below, has a housing which is formed of a housing lower part 3 and a housing upper part 4 and which can be seated with its housing lower part 3 on the solar module 2.

Within the housing lower part 3, there are several contact springs 5 which are used for making electrical contact with the terminal leads 6 of the solar module 2 which are made as flat conductors. Moreover, in the housing lower part 3 in the exemplary embodiment according to FIGS. 2, 3, 7, 10 and 11, there are two terminal elements 7 made as crimp terminals via which two external cables 8 are connected. Each contact spring 5 is connected via a respective metal part 9 to a respective terminal element 7 so that a terminal lead 6 contacted by means of the contact spring 5 can be connected in an electrically conductive manner to a cable 8 which is inserted through an opening 10 into the interior of the housing lower part 3.

FIGS. 2 to 13 show that several actuating elements 11 which project to the inside are formed on the cover-shaped housing upper part 4; using elements 11, the contact spring 5 can be moved out of first position in which it does not make contact with the terminal lead 6 (FIGS. 2, 4, 10, 13) into a second position in which second position the terminal lead 6 is contacted by the contact spring 5 when the housing upper part 4 is pressed onto the housing lower part 3 (FIGS. 3, 5, 10, 12).

Figure 4:
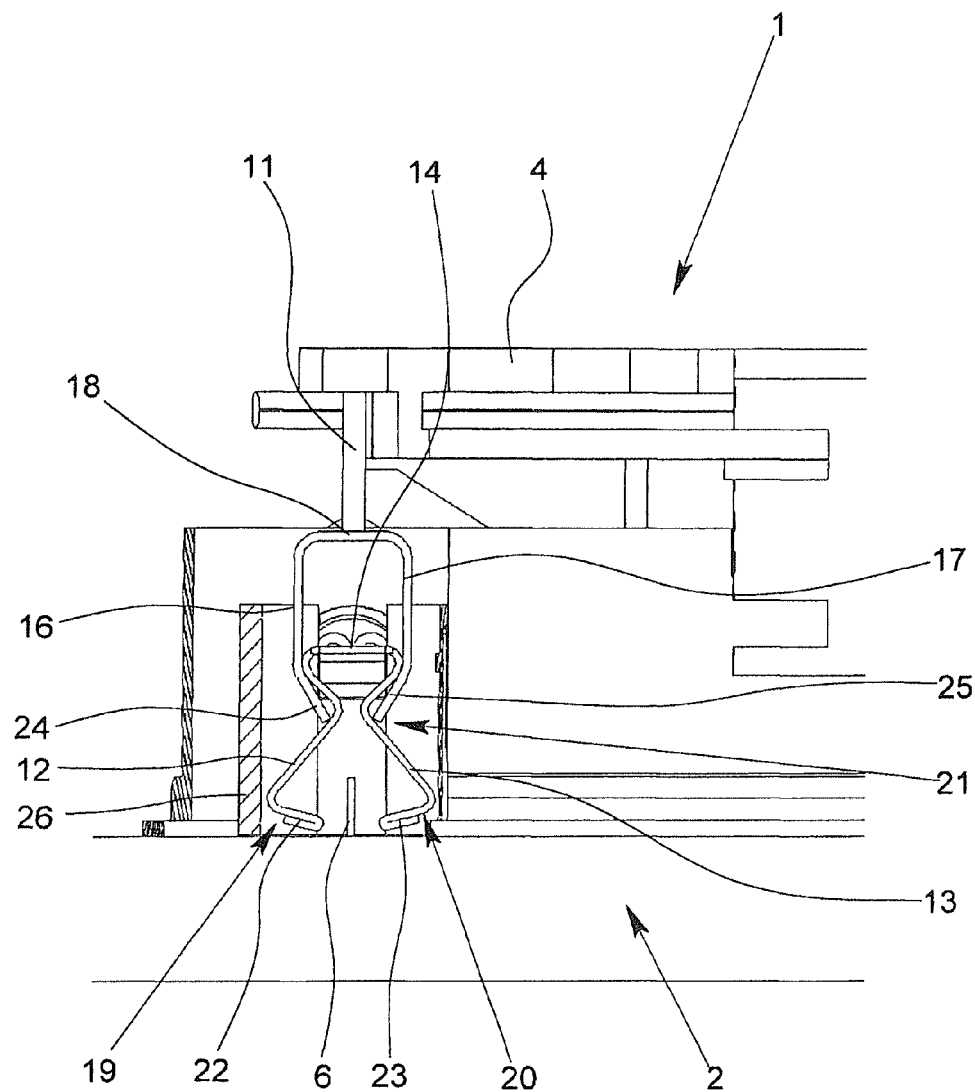
FIG. 4 is a front view of a portion of the terminating and connecting device in the position according to FIG. 2.
Figure 5:
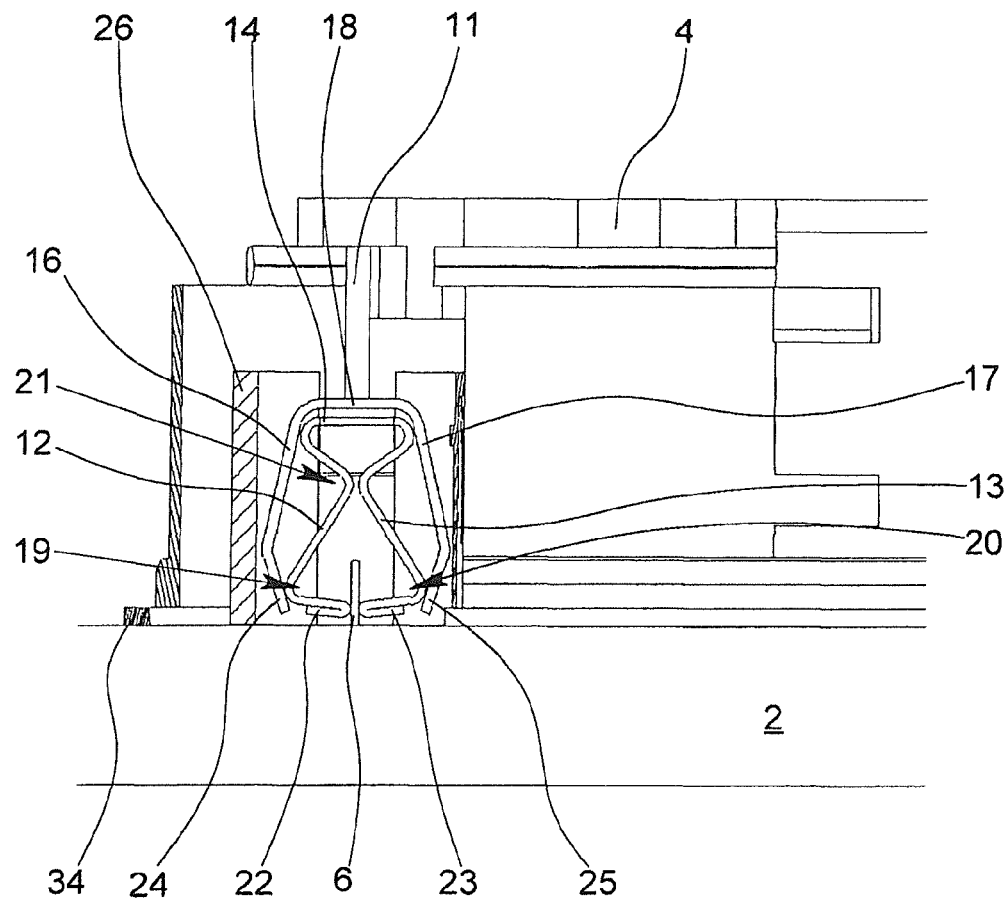
FIG. 5 is a front view of a portion of the terminating and connecting device in the second position according to FIG. 3.

In particular, the enlargements according to FIGS. 4 and 5 as well as 7 and 8 show that the contact spring 5 has two contact legs 12, 13 and a back 14 which connects the contact legs 12, 13. Moreover, a top spring 15 is movably located on the contact spring 5. The top spring 15 has two spring legs 16, 17 and a back 18 which connects the spring legs 16, 17. The end regions 19, 20 of the contact legs 12, 13 of the contact spring 5 are bent toward one another such that the end regions 19, 20 form the contact region of the contact spring 5, as is especially apparent from a comparison of FIGS. 4 and 5. Moreover, the contact spring 5 has a region 21 in which the contact legs 12, 13, are closer to one another than at the back 14. For this purpose, the contact legs 12, 13, proceeding from the back 14 to the region 21 are bent toward one another and then away from each other; then, toward the end regions 19, 20, the contact legs are again bent toward one another.

Finally, in the contact spring 5 shown in the figures, the ends 22, 23 of the contact legs 12, 13 are each bent back so that the contact legs 12, 13, are made rounded in the contact region of the contact spring 5. This results, on the one hand, in that the contact legs 12, 13 have a higher stability in the contact region, and on the other hand, the contact region does not have any sharp edges so that the terminal lead 6 is not damaged upon contact with the terminal lead 6.

Figure 8A:
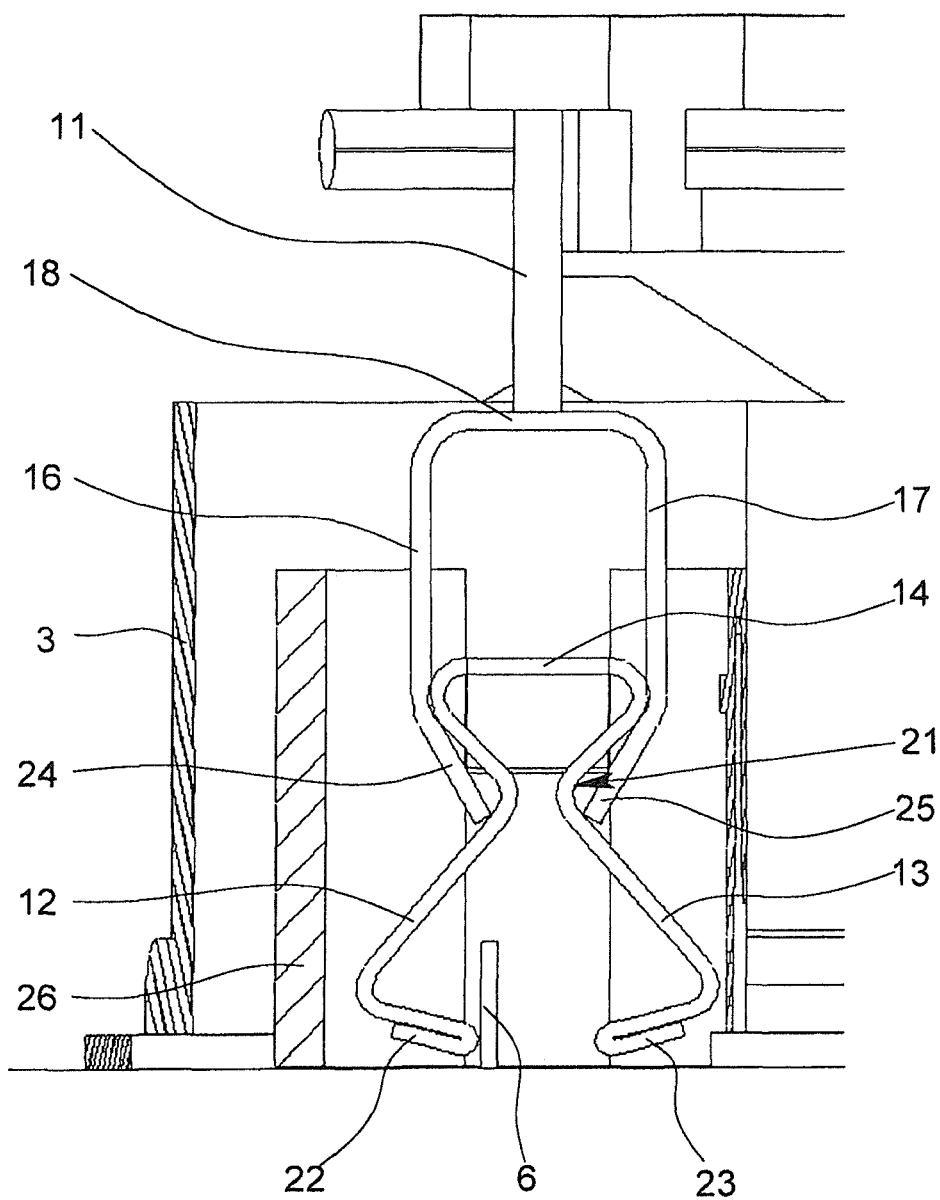

The top spring 15 is made essentially U-shaped, but the ends 24, 25 of the spring legs 16, 17 are bent toward one another, i.e., bent inward so that the distance between the ends 24, 25 of the spring legs 16, 17 is smaller than the distance between the spring legs 16, 17 in the vicinity of the back 18. The above described configuration of both the contact spring 5 and also the top spring 15 enables the top spring 15 to be held in the first position shown in FIG. 4 on the contact spring 5. The inwardly bent ends 24, 25 of the spring legs 16, 17 are located in the region 21 in which the contact legs 12, 13 of the contact spring 5 closer to one another as shown in FIGS. 4 and 8a & b.

If the housing upper part 4 is pressed onto the housing lower part 3, this leads to the actuating element 11 connected integrally to the housing upper part 4 being moved in the direction toward the housing lower part 3. Here, the actuating element 11 presses on the back 18 of the top spring 15, as a result of which the top spring 15 is pressed down. In doing so, the top spring 15 is pushed over the contact spring 5 such that, in the second position of the housing upper part 4 shown in FIG. 5, the contact legs 12, 13 of the contact spring 5 are compressed by the spring legs 16, 17 of the top spring 15 so far that the contact legs 12, 13 make contact with a terminal lead 6 which has been inserted between them, clamping it. In order to apply sufficiently high contact force via the contact spring 5 to the terminal lead 6, the top spring 15 is designed such that, as compared to the contact spring 5, it has a much greater spring force so that the contact legs 12, 13 of the contact spring 5 are reliably and permanently compressed in the second position by the spring legs 16, 17 of the top spring 15.

In the first exemplary embodiment, the metal part 9 is integrally connected to the contact spring 5 on one side and on its other side integrally to a terminal element 7 which is made as a crimp terminal. A contact carrier 26 of plastic is located in the housing lower part 3 for accommodating and holding the metal part 9 and one end of the cable 8 connected to the terminal element 7. In the exemplary embodiment shown in FIGS. 2 to 9, the contact carrier 26 is movably connected to the housing lower part 3 such that the contact carrier 26 can be moved out of a first upper position (FIGS. 6 and 7) into a second lower position (for example, FIGS. 2 and 4). The contact carrier 26 is likewise automatically "pressed down" by pressing the housing upper part 4 onto the housing lower part 3, as is described above.

Figure 6:
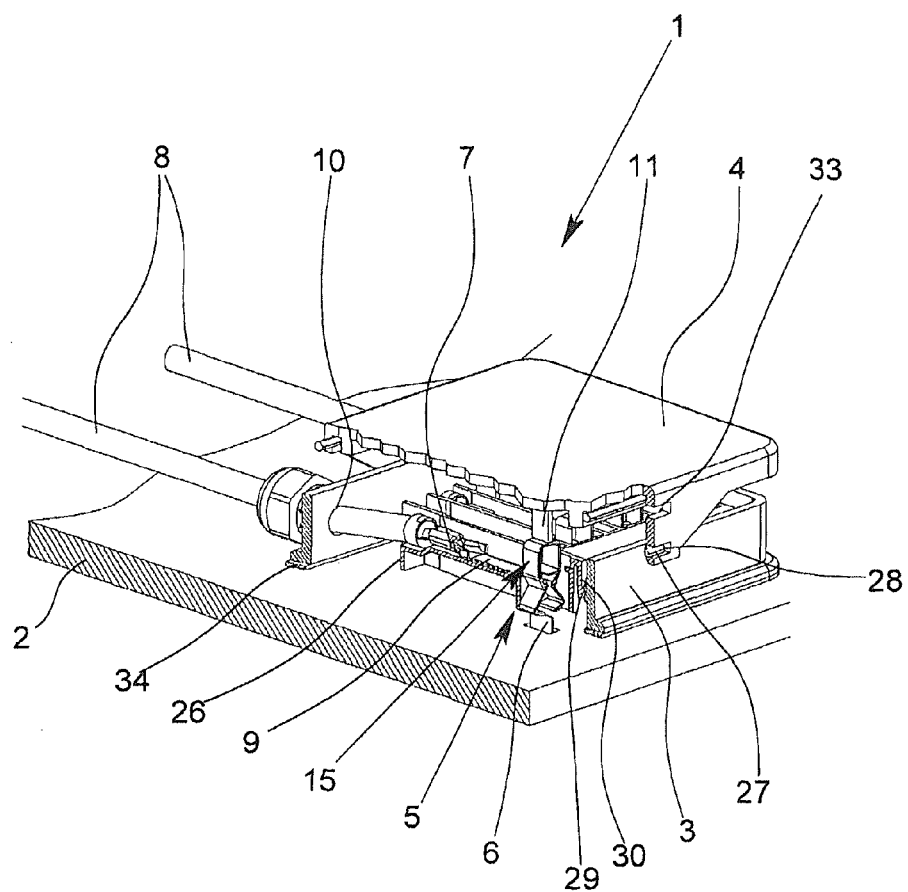
FIG. 6 shows the terminating and connecting device according to FIG. 1, with the housing upper part and the contact carrier in the upper position.
Figure 7:
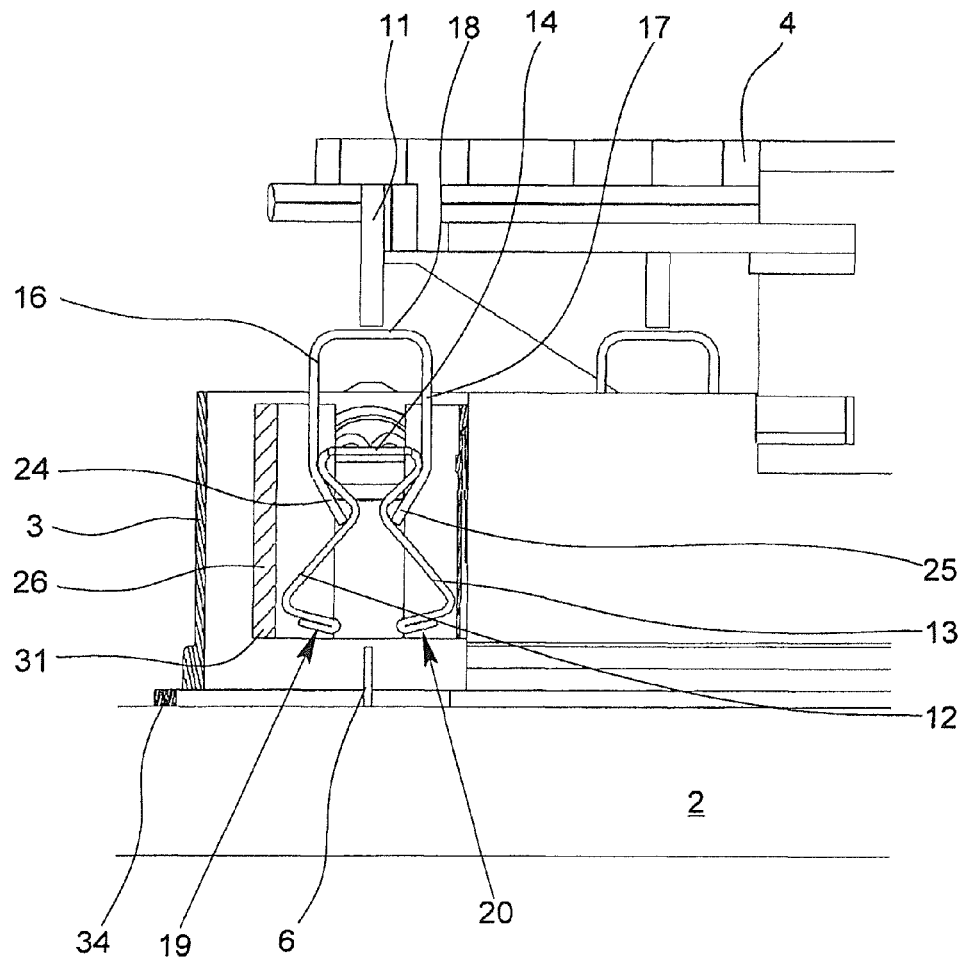
FIG. 7 is a front view of a portion of the terminating and connecting device in the position according to FIG. 6, FIGS. 8*a* & 8*b* are two front views of a portion of the terminating and connecting device in accordance with the invention in the position according to FIG. 4.

In the uppermost position of the housing upper part 4 shown in FIGS. 6 and 7, the housing upper part 4 is located in a first housing catch position in which a catch projection 27 on the housing lower part 3 is locked in a lower catch recess 28 on the housing upper part 4 (FIG. 6). In this position, the contact carrier 26 is likewise locked in its upper position. For this purpose, on the face side of the contact carrier 26, a catch projection 29 is made which is locked under an upper catch projection 30 on the inside of the housing lower part 3. In this position, the lower side 31 of the contact carrier 26 is spaced from the solar module 2. Moreover, in this position, the end regions 19, 20 of the contact legs 12, 13 of the contact spring 5 are positioned above a terminal lead 6 which is to be connected.

Figure 2:
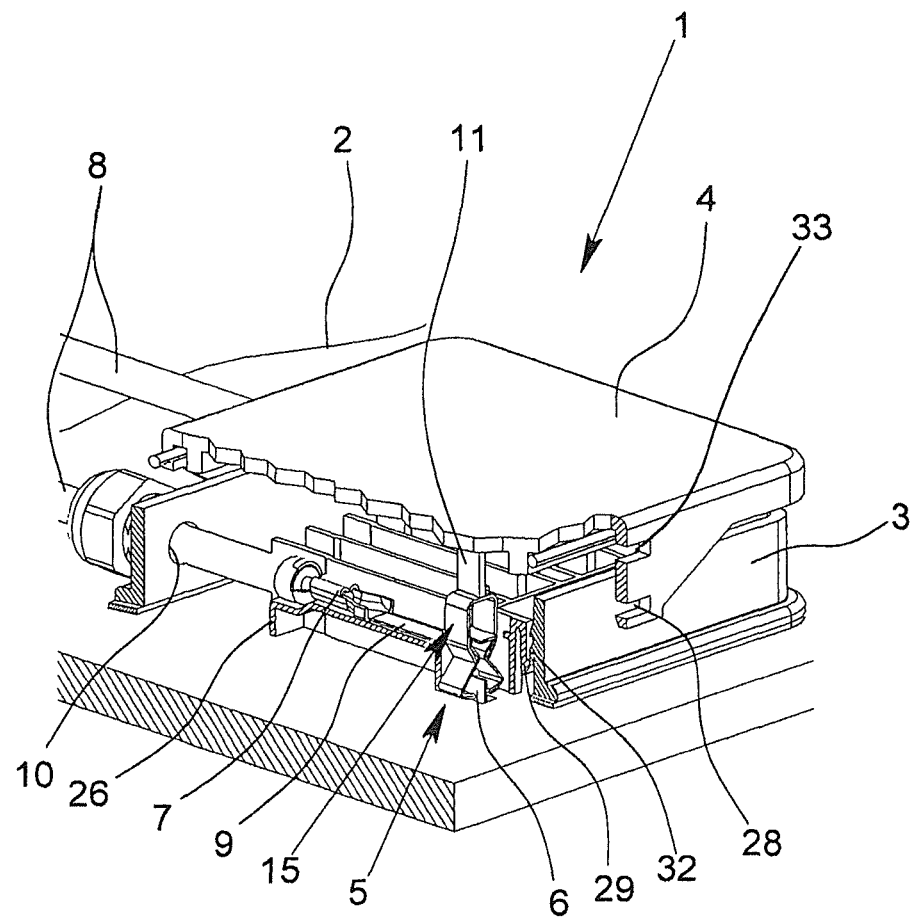
FIG. 2 is a partial sectional view of the terminating and connecting device according to FIG. 1, seated on the solar module, in a position which is not in contact with the terminal lead.

If the housing upper part 4 is pressed down in the direction toward the housing lower part 3, the free end of the actuating element 11 presses on the back 18 of the top spring 15 located underneath. First, the contact spring 5, and thus, also the movable contact carrier 26 are pressed down by the above described arrangement of the top spring 15 on the contact spring 5 until the bottom 31 of the contact carrier 26 sits on the solar module 2 (FIGS. 2 and 4). Here, the catch projection 29 of the contact carrier 26 slides along the bevel of a second lower catch projection 32 on the inner side of the housing lower part 3 until the catch projection 29 locks behind the catch projection 32 (FIG. 2). However, the position of the top spring 15 relative to the contact spring 5 has not yet changed. The terminal lead 6 is now located between the end regions 19, 20 of the contact legs 12, 13 of the contact spring 5, but the contact legs 12, 13 are not yet compressed by the top spring 15 so that the terminal lead 6 is not yet contacted either.

If the housing upper part 4 is pressed or slipped further onto the housing lower part 3 until the catch projection 27 on the housing lower part 3 fits into an upper catch recess 33 on the housing upper part 4 (FIG. 3), the top spring 15 is pushed farther down, in the direction toward the solar module 2. Since the contact carrier 26 sits on the solar module 2, and thus, can no longer be pressed further down, the top spring 15 is now pushed over the contact spring 5, the spring legs 16, 17 sliding along the contact legs 12, 13 of the contact spring 5 and in doing so compressing the contact legs 12, 13 to such an extent that they make contact with the terminal lead 6 located between them by clamping (FIG. 5).

Figure 3:
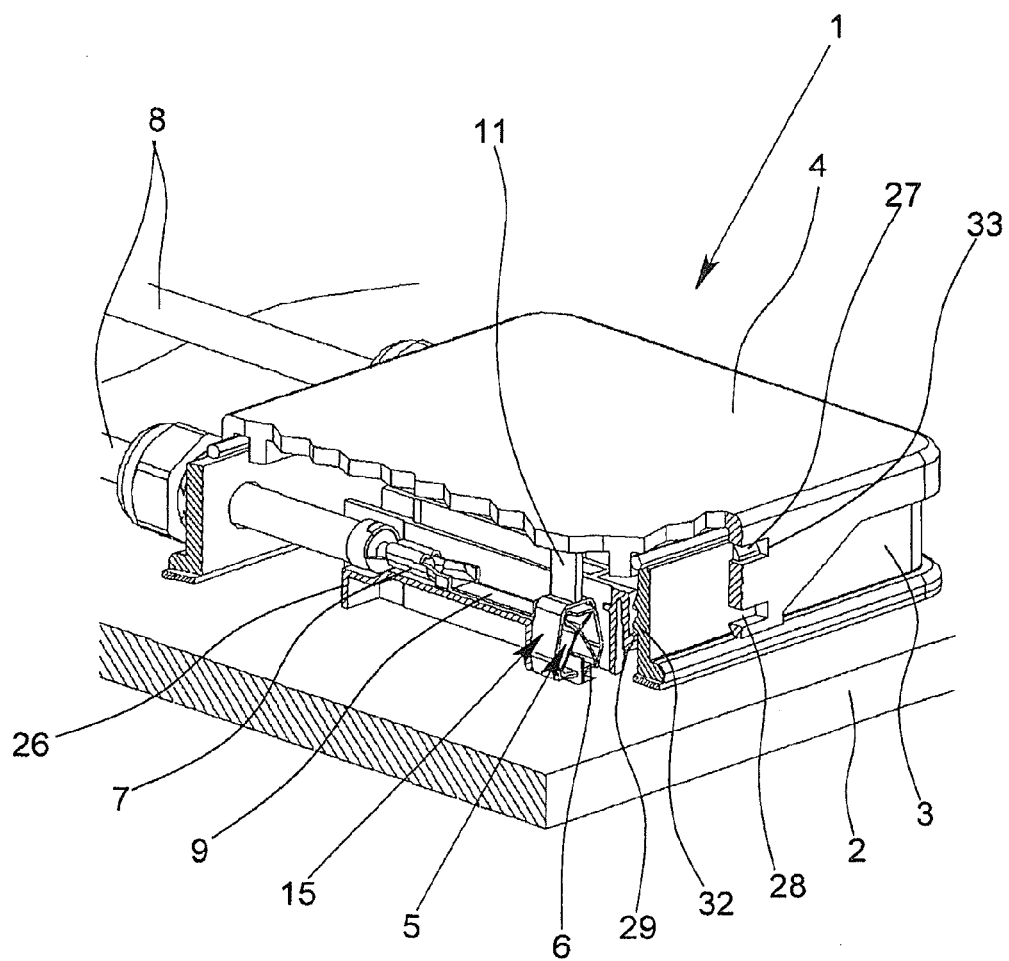
FIG. 3 is a view similar to that of Figure two, but showing the terminating and connecting device in the position making contact with the terminal lead.

In the second position of the contact spring 5 or of the top spring 15 which is shown in FIGS. 3 and 5, the housing upper part 4 is pressed completely onto the housing lower part 3 so that the housing of the junction box 1 is closed. In this position, the top spring 15 sits tensioned over the contact spring 5 so that the top spring 15 or the spring legs 16, 17 apply a contact force to the terminal lead via the contact legs 12, 13 to the terminal lead 6. As is especially apparent from FIG. 5, the ends 24, 25 of the spring legs 16, 17 bent to the inside are pushed onto the contact legs 12, 13 so far that self-locking is implemented and the top spring 15 cannot slip back up again in the direction of its first position without an external force being applied.

Figure 8B:
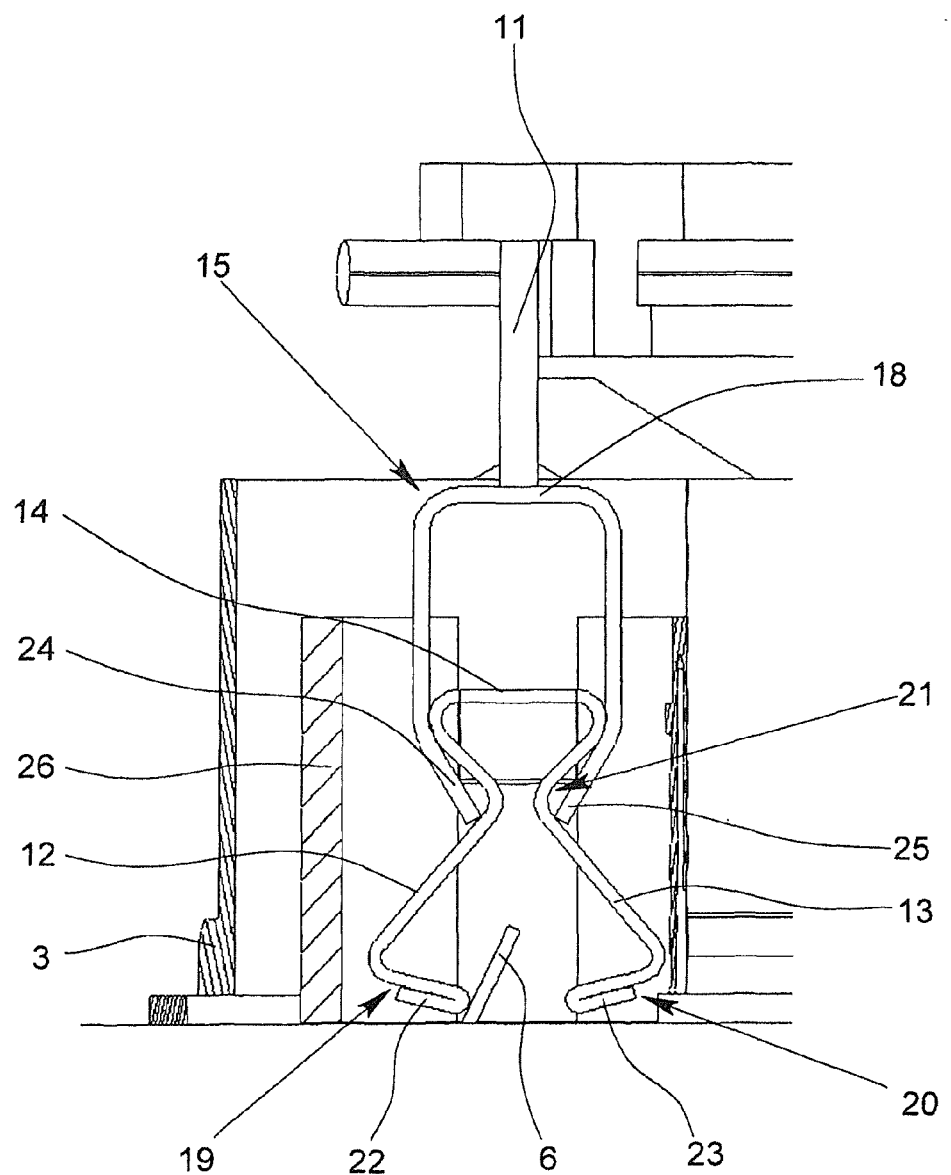
Figure 9:
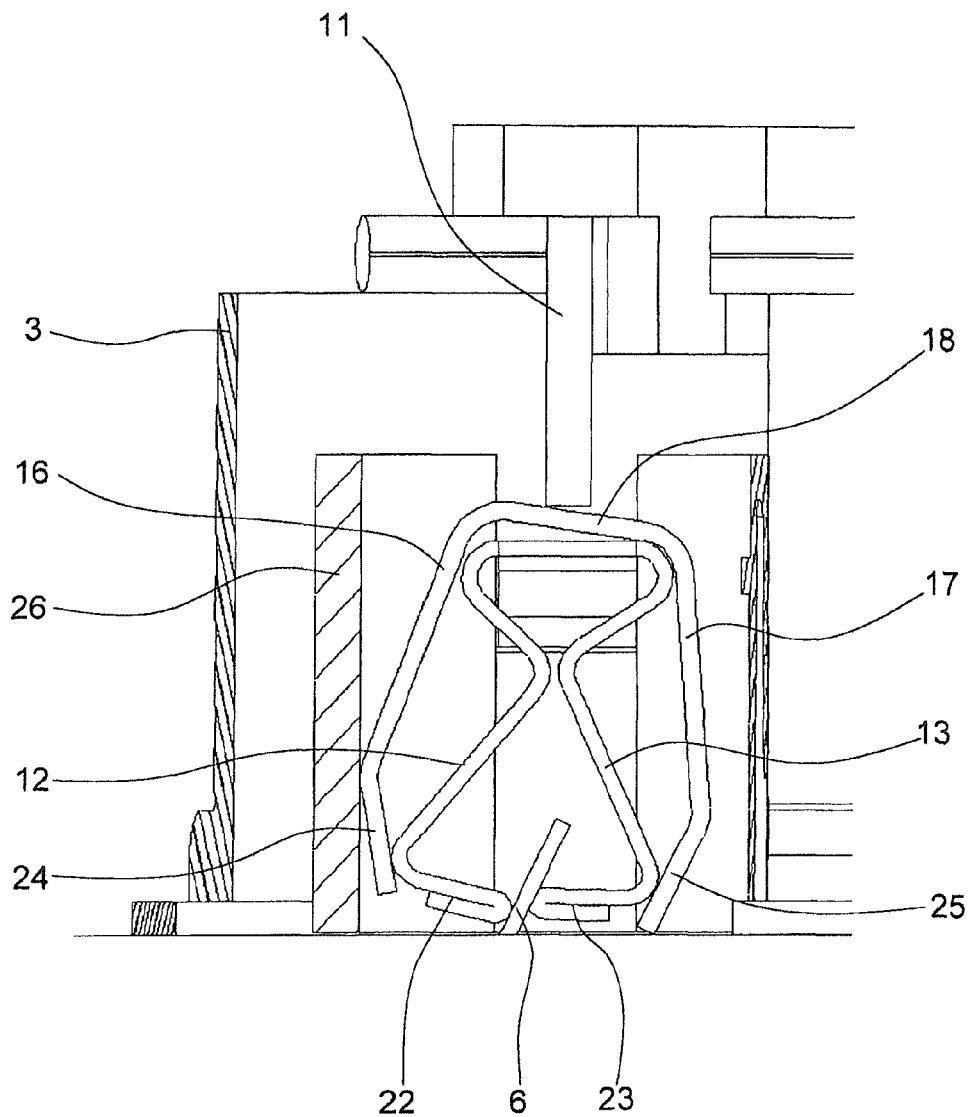
FIG. 9 shows a front view of a portion of the terminating and connecting device in the position according to FIG. 5, FIGS. 10a & 10b are perspective and side sectional views, respectively, of a second exemplary embodiment of a terminating and connecting device in a position not yet in contact with the terminal lead.

FIGS. 8a and 8b show that the junction box 1 in accordance with the invention is relatively insensitive to position tolerances of the terminal leads 6. Since the contact spring 5 is opened when the junction box 1 is seated on the solar module 2, and in doing so, the distance between the end regions 19, 20 of the contact legs 12, 13 is relatively great, so that the contact spring has a relatively wide clamping site, both terminal leads 6 which are located laterally offset to the "normal position" (FIG. 8a) and also terminal leads 6 which project laterally from the solar module 2 (FIG. 8b) can be reliably contacted. FIG. 9 shows how contact spring 5 can also make reliable contact with terminal leads 6 which project obliquely from the solar module 2.

FIGS. 10 and 11 show a second exemplary embodiment of a junction box 1 in accordance with the invention, in FIG. 10 the terminal lead 6 not yet being contacted, while in FIG. 11 the terminal lead 6 is contacted by the contact spring 5. In this exemplary embodiment first the terminal lead 6—compared to the above described exemplary embodiment—turned by 90° is routed out of the solar module 2. Corresponding thereto the contact spring 5 and the top spring 15 turned by 90° are located in the housing lower part 3. Moreover this exemplary embodiment of the junction box 1 differs especially by a somewhat different configuration of the contact spring 5.

Figure 10A:
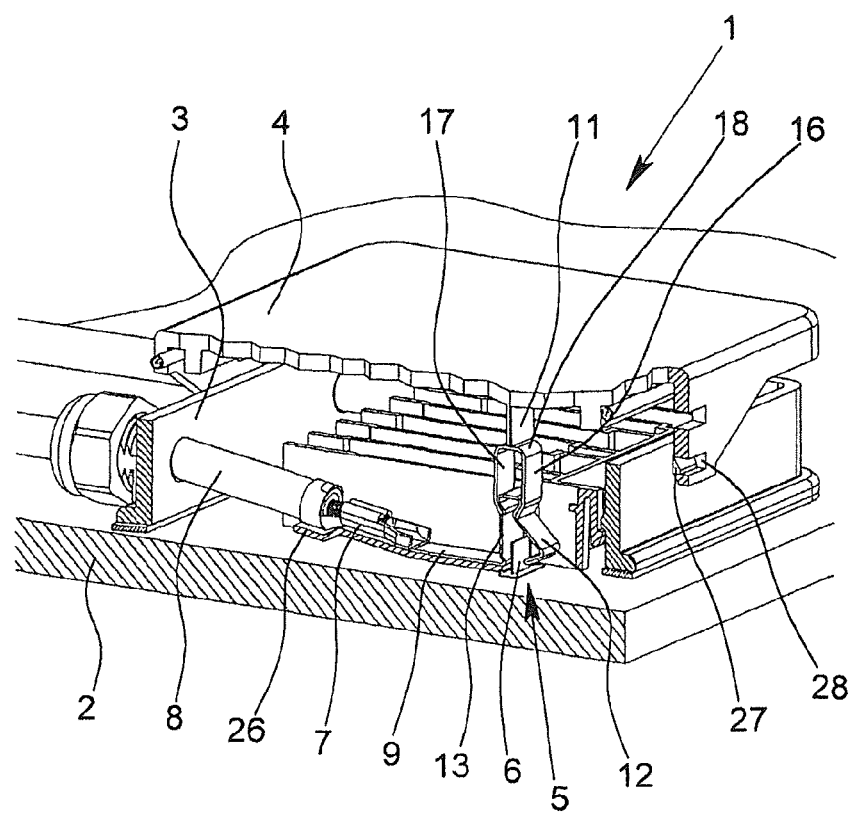
Figure 10B:
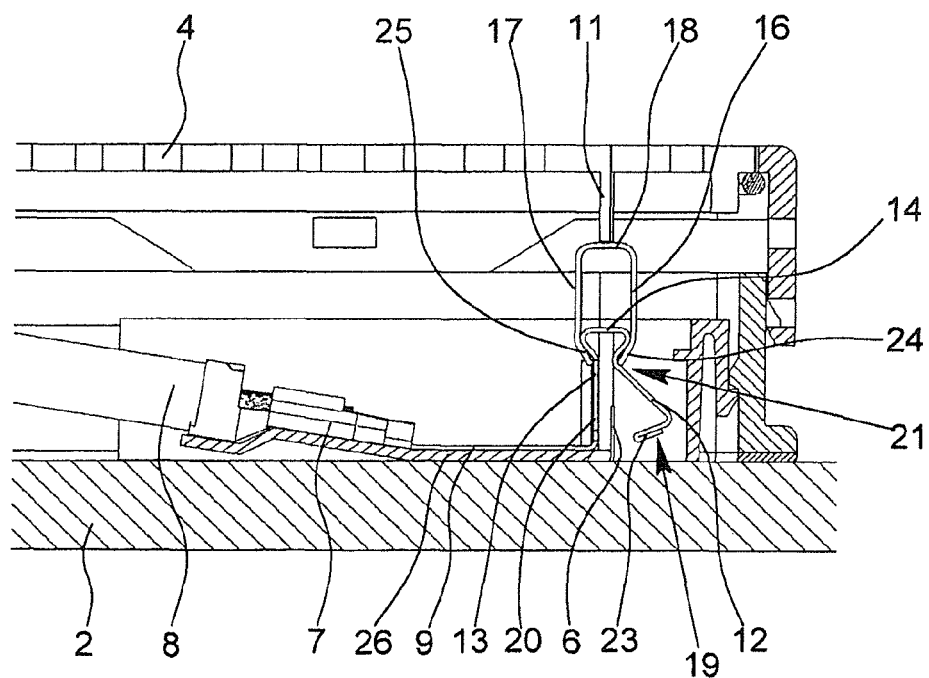
Figure 11A:
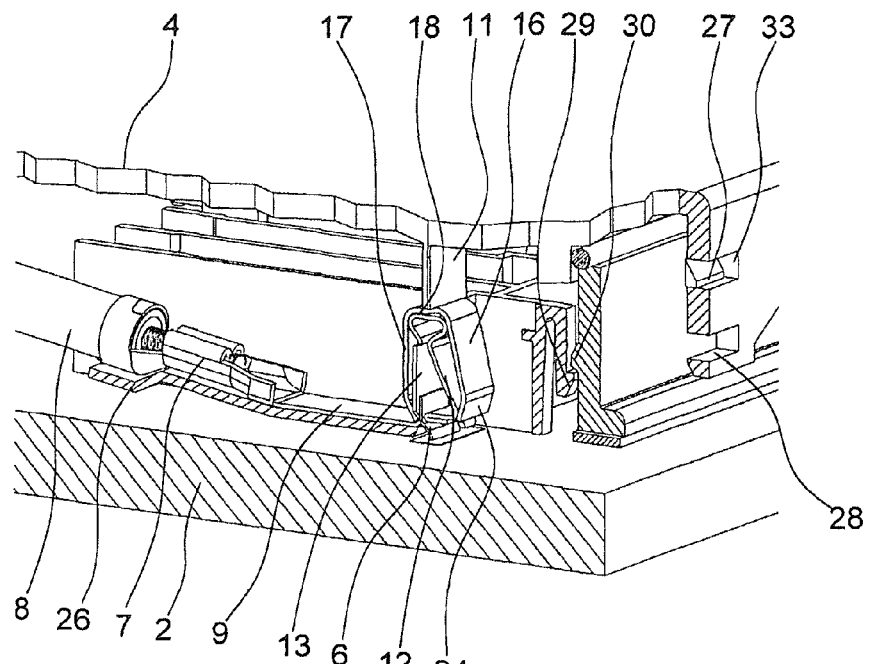
FIGS. 11a & 11b are views corresponding to FIGS. 10a & 10b, showing the terminating and connecting device in a position which makes contact with the terminal lead.
Figure 11B:
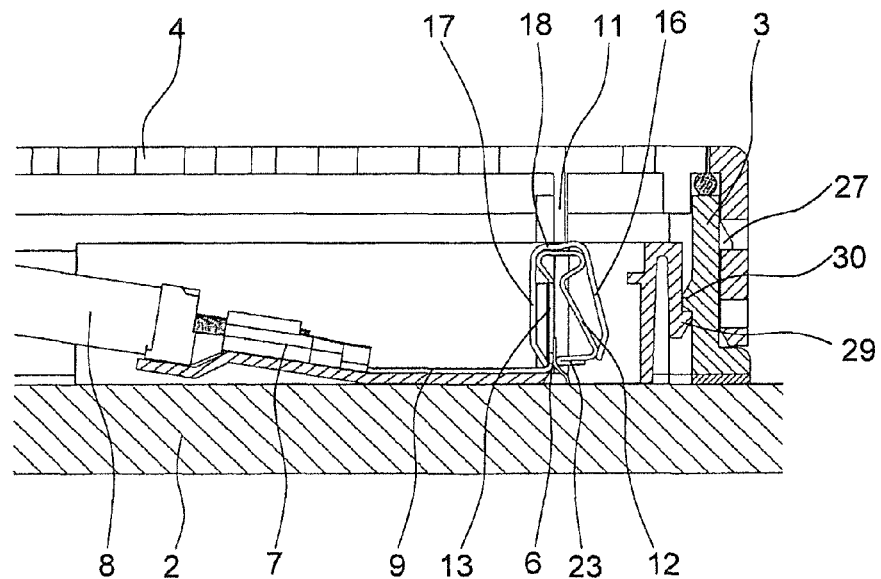

The contact spring 5 shown in FIGS. 10a, b and 11a, b also has two contact legs 12, 13 and a back 14, but only one contact leg 12 is made elastic, while the other contact leg 13 is rigid. The end region 19 of the elastic contact leg 12 is also bent here in the direction to the rigid contact leg 13 and the terminal lead 6, the end 22 of the contact leg 12 being bent back such that the contact leg 12 has a rounded contact region. The free end of rigid contact leg 13 is conversely made straight and is connected integrally to one end of the metal part 9 on whose other end a crimp terminal is made as the terminal element 7 for the cable 8.

So that the top spring 15 is also held in the first position (FIG. 10a, 10b) on the contact spring 5, the elastic contact leg 12, proceeding from the back 14 of the contact spring 5, is bent first in the direction toward the rigid contact leg 13 and then bent back towards its end region 19 away from the rigid contact leg 13. This contact spring 5 thus also has a region 21 which is located between the back 14 and the end regions 19, 20 of the contact legs 12, 13 and in which the contact legs 12, 13 have a shorter distance from one another than at the back 14. This region 21 is used for holding the top spring 15, for which the ends 24, 25 of their spring legs 16, 17 bent toward one another overlap the back 14 of the contact spring 5 and end in the region 21 of the contact spring 5.

When the housing upper part 4 is pressed down, the top spring 15 is also pressed down by the actuating element 11. In doing so, the top spring 15 is pushed over the contact spring 5 such that, in the second position of the housing upper part 4 shown in FIGS. 11a, 11b, the elastic contact leg 12 of the contact spring 5 is deflected by the spring leg 16 of the top spring 15 in the direction toward the rigid contact leg 13 so far that the terminal lead 6 is contacted and clamped between the contact legs 12, 13. If the terminal lead 6 is located spaced somewhat apart from the rigid contact leg 13, this leads to the terminal lead 6 being slightly bent; however, this is not a problem due to the small thickness of the terminal lead 6. Since the rigid contact leg 13 in its end region 20 is connected integrally to the metal part 9, good current transfer from the terminal lead 6 via the rigid contact leg 13, the metal part 9 and the terminal lead 7 to the cable 8 can be achieved.

Figure 12:
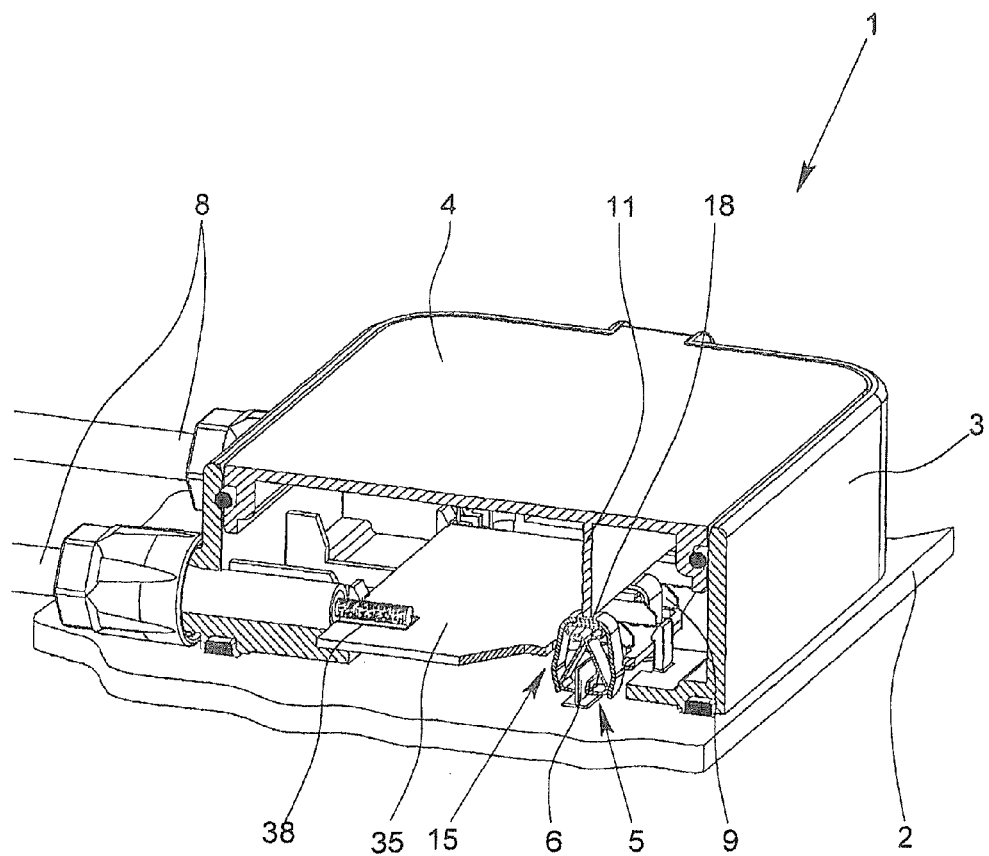
FIG. 12 is a perspective sectional view of another embodiment of a terminating and connecting device in a position which makes contact with the terminal lead.
Figure 13:
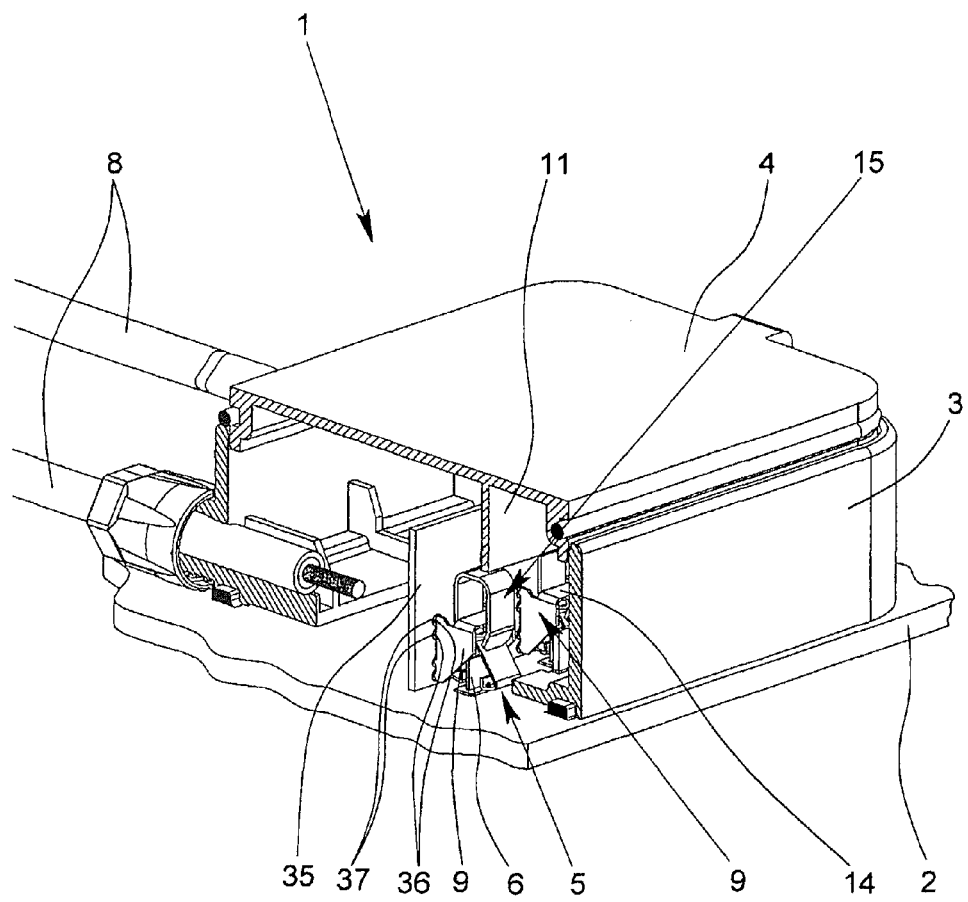
FIG. 13 shows a view corresponding to FIG. 12, but in a position not yet in contact with the terminal lead.

In the embodiments of the junction box 1 which are shown in FIGS. 12 and 13, the metal part 9 is connected simply in one piece to the contact spring 5, while between the metal part 9 and the free end of the cable 8, there is a circuit board 35 as another component. The connection between the metal part 9 and the circuit board 35 takes place via the solder terminal pins 36 which are made on the free end of the metal part 9 and which are inserted and soldered in corresponding holes 37 in the circuit board 35. The electrical connection between the cable 8 and the circuit board 35 takes place by the free end of the cable 8 being soldered on a solder terminal 38 located on the circuit board 35. The electrical connection between the terminal lead 6 and the cable 8 takes place via the contact spring 5, the metal part 9 connected integrally to it with the solder terminal pins 36, the holes 37 and the circuit board 35 with the solder terminal 38, the solder terminal 38 being electrically connected to at least one hole 37 via a printed conductor which is not shown here and which is made on the circuit board 35.

The junction boxes 1 shown in FIGS. 12 and 13 differ by the different arrangement and alignment of the circuit board 35 provided in the housing lower part 3. While for the junction box 1 according to FIG. 12, the circuit board 35 is located parallel to the solar module 2, i.e., horizontally, the circuit board 35 for the junction box 1 according to FIG. 13 is located perpendicular to the solar module 2. FIG. 13 does not show the electrical connection of the free end of the cable 8 to the circuit board 35; in this version, the circuit board 35 has either another section which runs horizontally and to which the cable 8 is soldered, or a plug connection is attached to the circuit board 35 and to which the free end of the cable 8 is connected.

Figure 14A:
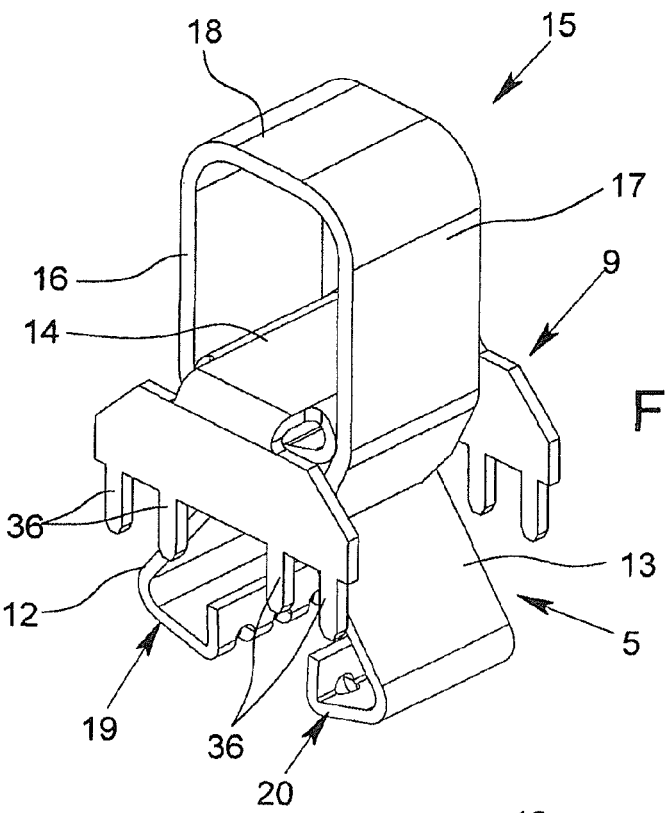
FIG. 14 shows two versions of the contact spring, with a metal part and top spring held on the contact spring in the first position.
Figure 14B:
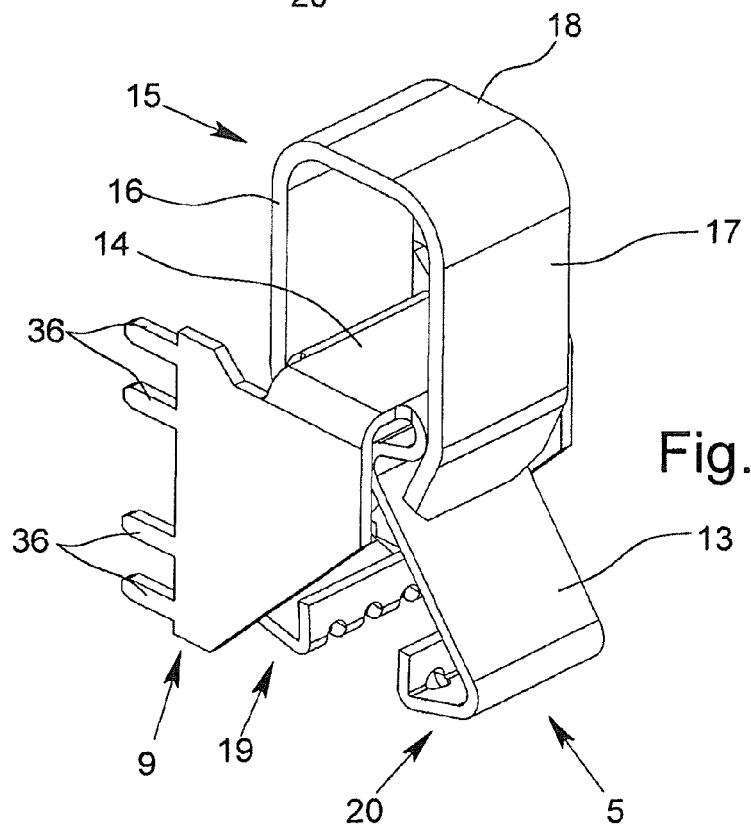

Corresponding to the alignment of the circuit board 35 to which the metal part 9 is connected, the solder terminal pins 36 of the metal part 9 are also aligned as can be seen especially in the two drawings of FIG. 12. The metal part 9 shown in FIG. 14a is used for the junction box 1 as shown in FIG. 12 and the metal part 9 shown in FIG. 14b is used for the junction box 1 as shown in FIG. 13. In both cases, the metal part 9 is connected in one piece to the contact spring 5, specifically to the back 14 so that the contact spring 5 and the metal part 9 can be produced as a punched and bent part.

As has been described above in detail, with the junction box 1 in accordance with the invention, a reliable, permanent electrical connection between the terminal leads 6 of a solar module 2 and the cables 8 inserted into the junction box 1 can be easily produced by the junction box 1 simply being seated on the side of the solar module 2 from which the terminal leads 6 project. The housing, when seated on the solar module 2, is simultaneously attached to the latter by an adhesive layer 34 which is located on the bottom of the housing lower part 3 (see, e.g., FIGS. 5-7). Here, when the junction box 1 is seated on the solar module 2, the housing upper part 4 is connected to the housing lower part 3, specifically locked in the upper housing catch position. Then, only the housing upper part 4 which is used as a cover need be pressed completely onto the frame-like housing lower part 3 until the housing upper part 4 locks in the second housing lock position in which the terminal leads 6 are contacted and the housing is tightly sealed.

What is claimed is:

1. A terminating and connecting device for electrical connection of an electrical device on a solar module, comprising,
a housing having a housing lower part and a housing upper part, the housing having at least one opening for inserting of at least one cable,
at least one contact spring for electrically contacting at least one terminal lead extending from the electrical device, the contact spring having two contact legs connected by a back,
at least one terminal element located in the housing connecting with the at least one cable, and
at least one metal part via which the at least one terminal lead contacted by the contact spring can be connected to a cable connected by the terminal element in an electrical conductive manner,
at least one extended actuating element is positioned in the housing upper part, and
at least one top spring which has two spring legs and a back which connects the spring legs, the at least one top spring being movable relative to the at least one contact spring,
wherein the at least one contact spring, the at least one terminal element and the at least one metal part are provided in the housing lower part,
wherein when pressing of the housing upper part onto the housing lower part, the contact spring is moved from a first position out contact with the terminal lead into a second position contacting the terminal lead by the at least one actuating element pressing on the back of the at least one top spring so that the top spring is moved over the at least one contact spring, such that the position of at least one contact leg of the contact spring is changed by the top spring in a manner clamping the at least one terminal lead in between the contact legs.

2. The terminating and connecting device as claimed in claim 1, wherein the contact legs of the at least one contact spring are elastic, and wherein the top spring is made and arranged so as to compress the contact legs of the contact spring when the housing upper part is pressed onto the housing lower part.

3. The terminating and connecting device as claimed in claim 2, wherein end regions of the contact legs are bent toward one another so that the end regions form a contact region of the contact spring.

4. The terminating and connecting device as claimed in claim 3, wherein the contact legs, proceeding from the back of the contact spring, first extend toward one another and then away from one another toward their end regions so that the contact spring has a region located between the back and the end regions of the contact legs in which the contact legs are a shorter distance from one another than at the back of the contact spring.

5. The terminating and connecting device as claimed in claim 3, wherein the ends of the contact legs are each bent back so that the contact legs form rounded contact regions.

6. The terminating and connecting device as claimed in claim 1, wherein one of the contact legs of the contact spring is elastic and the other is rigid, and wherein the top spring is made and arranged such that the elastic contact leg of the contact spring is pressed by the top spring toward the rigid contact leg when the housing upper part is pressed onto the housing lower part.

7. The terminating and connecting device as claimed in claim 6, wherein the end region of the elastic contact leg is bent toward the rigid contact leg, the end of the elastic contact leg having a rounded contact region.

8. The terminating and connecting device as claimed in claim 7, wherein the elastic contact leg, proceeding from the back of the contact spring first extends toward the rigid contact leg and then towards its end region extends away from the rigid contact leg so that the contact spring has a region located between the back and the end regions of the contact legs in which the contact legs are a shorter distance from one another than at the back of the contact spring.

9. Terminating and connecting device as claimed in claim 8, wherein the ends of the spring legs of the top spring are bent toward one another and overlap and the region of the contact spring in which the contact legs are a shorter distance from one another than at the back of the contact spring.

10. Terminating and connecting device as claimed in claim 1, wherein the contact spring and the terminal element are integrally connected to the metal part.

11. Terminating and connecting device as claim 1, wherein at least one contact carrier of an insulating material is connected to the housing lower part, said at least one metal part being held in said at least one contact carrier.

12. Terminating and connecting device as claimed in claim 11, wherein the contact carrier is movably connected to the housing lower part such that, when the housing upper part is pressed onto the housing bottom part, the contact carrier is movable out of a first position into a second position, the end regions of the contact legs of the contact spring being positioned above a terminal lead which is to be connected in a first position of the contact carrier even when the housing lower part is seated on the electrical device, the terminal lead being located between the end regions of the contact legs of the contact spring in a second lower position of the contact carrier.

13. Terminating and connecting device as claimed in claim 12, wherein two catches are located between the housing lower part and the contact carrier, each catch fixing the contact carrier in a respective one of the first position and the second position of the contact carrier.

14. Terminating and connecting device as claim 1, wherein the metal part is connected directly to the contact spring and via a circuit board or lead frame indirectly to the terminal element.

15. Terminating and connecting device as claimed in claim 14, wherein the metal part has a free end which has a solder terminal pin via which the metal part is connected to the circuit board or lead frame.

16. Terminating and connecting device as claimed in claim 14, wherein the terminal element is a solder terminal which is located on the circuit board or lead frame.

17. Terminating and connecting device as claimed claim 1, wherein two catches are provided by which the housing lower part and the housing upper part can be fixed relative to one another in each of a first position for reception of a terminal lead between the contact legs and a second position a terminal lead is clamped between the contact legs.

18. Terminating and connecting device as claim 1, wherein the housing lower part is a housing frame with an open bottom and the housing upper part is made a cover.

19. The terminating and connecting device as claim 1, wherein an adhesive layer for attaching the housing lower part on one side of the electrical device is located on a side of the housing lower part that faces away from the housing upper part.

20. The terminating and connecting device as claim 1, wherein said at least one contact spring comprises two contact springs, said at least one terminal element comprises two terminal elements, said at least one metal part comprises two metal parts and said at least one top spring comprises two top springs and wherein the two metal parts are connected.

21. The terminating and connecting device as claimed in claim 4, wherein the ends of the spring legs of the top spring are bent toward one another and overlap and the region of the contact spring in which the contact legs are a shorter distance from one another than at the back of the contact spring.

* * * * *